USOO5206552A

United States Patent [19]

Iwashita

[11] Patent Number: 5,206,552
[45] Date of Patent: Apr. 27, 1993

[54] SENSE AMPLIFIER FOR NON-VOLATILE SEMICONDUCTOR STORAGE DEVICE

[75] Inventor: Shinichi Iwashita, Tokyo, Japan

[73] Assignee: NEC Corporation, Japan

[21] Appl. No.: 776,791

[22] Filed: Oct. 15, 1991

[30] Foreign Application Priority Data

Oct. 12, 1990 [JP] Japan .................................. 2-273867

[51] Int. Cl.$^5$ ........................... H03F 3/45; H03K 5/22
[52] U.S. Cl. .................................... 307/530; 307/355; 307/359; 307/548; 307/550; 365/189.06; 365/189.11; 365/205; 365/208
[58] Field of Search ............... 307/355, 530, 362, 359, 307/550, 263, 542, 548, 450, 451; 365/203, 207–208, 210, 189.06, 189.11

[56] References Cited

U.S. PATENT DOCUMENTS

| 4,728,900 | 3/1988 | Nakagawara et al. | 307/530 |
| 4,802,138 | 1/1989 | Shimamura | 307/530 |
| 4,827,158 | 5/1989 | Matsumura | 307/355 |
| 5,077,496 | 12/1991 | Wolczanski | 307/355 |

FOREIGN PATENT DOCUMENTS 2089612 6/1982 United Kingdom .

OTHER PUBLICATIONS

IBM Tech. Disc. Bul. "Static Sense Amplifier" vol. 28 No. 8 Jan., 1986.

Primary Examiner—William L. Sikes
Assistant Examiner—Margaret Rose Wambach
Attorney, Agent, or Firm—Laff, Whitesel, Conte & Saret

[57] ABSTRACT

A sense amplifier for a non-volatile semiconductor storage device includes a true and a complementary load circuit which are for holding the potentials of input signals and which have the current driving capability lower than that of each memory cell of the semiconductor storage device. These true and complementary load circuits are connected with a true and a complementary input terminal of the conventional sense amplifier. In accordance with the output logical value of the sense amplifier, if it is in the "H" level, the complementary load circuit is activated whereas if it is in the "L" level, the true load circuit is activated. In this way, the operation speed of the sense amplifier at a memory cell selecting operation can be effectively improved.

5 Claims, 3 Drawing Sheets

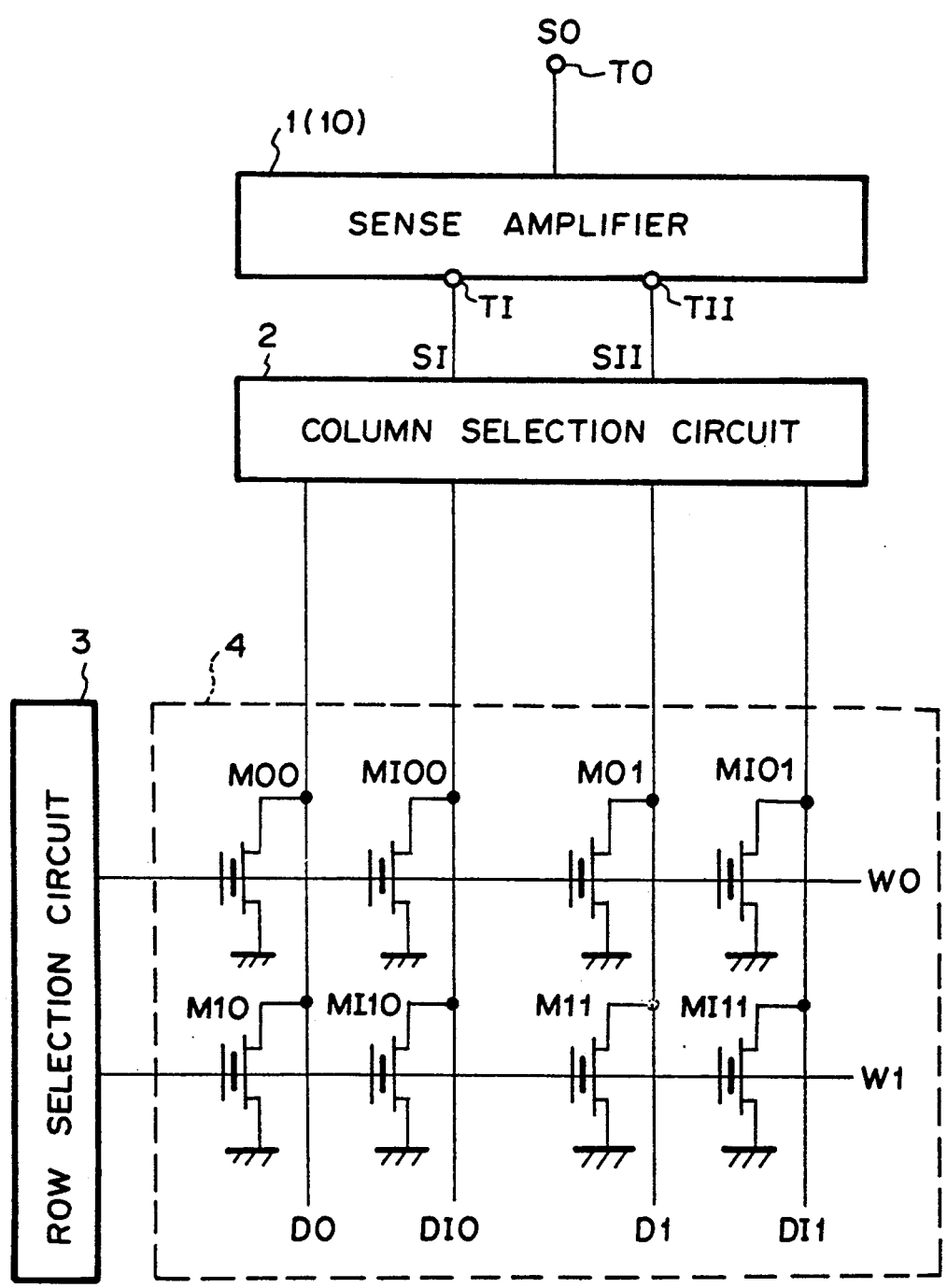
F I G. 2

SENSE AMPLIFIER FOR NON-VOLATILE SEMICONDUCTOR STORAGE DEVICE

BACKGROUND OF THE INVENTION

1. Field of the Invention

The present invention relates to a sense amplifier, and more particularly to a sense amplifier for use in a non-volatile semiconductor storage device.

2. Description of the Related Art

An example of previously known sense amplifier circuits for use in a non-volatile semiconductor storage device is disclosed in the Japanese Patent Application Kokai No. Hei 2(1990)-9094, and its circuit diagram is shown in FIG. 1.

As seen from FIG. 1, the conventional sense amplifier 1 is composed of a true input circuit 11, a complementary input circuit 12, a true current mirror circuit 13, a complementary current mirror circuit 14, and an output current mirror circuit 15. Specifically, the true sense amplifier 11 which receives a true input signal SI applied through a true input terminal TI is composed of an N-channel MOS transistor (hereinafter referred to as an "NMOS" transistor) N1 and an inverter IN1, and the load therefor is the true current mirror circuit 13 consisting of P-channel MOS transistors (hereinafter referred to as "PMOS" transistors) P1 and P3. In the same manner, the complementary input circuit 12 which receives a complementary input signal SII applied through a complementary input terminal TII is composed of an NMOS transistor N2 and an inverter IN2, and the load therefor is the complementary current mirror circuit 14 consisting of PMOS transistors P2 and P4. The output current mirror circuit 15 is composed of two NMOS transistors N3 and N4 that function the loads for the current mirror circuits 13 and 14, respectively. The sense amplifier output signal SO at an output terminal TO is derived from the drain electrode of the NMOS transistor N3 in the output current mirror circuit 15.

The true and complementary input circuits 11 and 12 are symmetrical to each other. In connection with the true input circuit 11, for example, an input terminal of the inverter IN1 is connected to the source of the NMOS transistor N1, and an output terminal thereof is connected to the gate of the same NMOS transistor N1 so that a negative feedback circuit is formed thereby.

An explanation of the operation of the conventional sense amplifier 1 shown in FIG. 1 will be given hereunder.

FIG. 2 shows an arrangement of the non-volatile semiconductor storage device including a sense amplifier. The explanation on this arrangement applies also to an embodiment of the present invention which will be explained later.

As seen from FIG. 2, the non-volatile semiconductor storage device is composed of a sense amplifier 1, a column selection circuit 2, a row selection circuit 2 and a memory cell array 4.

For brevity of the following explanation, the memory cell array 4 (FIG. 2) is composed of 4 bits, i.e., two row lines W0 and W1, and two pairs of column lines D0, DI0 and D1, DI1. A pair of true and complementary memory cells, e.g., a pair of memory cells M00 and MI00 constitute 1 bit. The memory device may be an EPROM (Electrically Programmable ROM) having a plurality of FAMOSs (Floating Avalanche MOSs) as the memory cells.

In FIG. 2, each of the memory cells M00, MI01, MI10 and M11 that are not still in a programmed state turns on when the corresponding row line is selected in reading operation. On the other hand, each of the remaining memory cells MI00, M01, M10 and MI11 is already in a programmed state and its threshold voltage has been increased to about 10 V, so that even when the corresponding row line is selected, it will not turn on. Here, the pair of true and complementary input signals SI and SII in FIG. 1 correspond to a pair of true and complementary input signals at the input terminals T1 and TII in FIG. 2.

Now, on the assumption that the pair of column lines D0 and DI0 are selected and fixed at this selected state wherein the pair of column lines D0 and DI0 are respectively connected, through the column selection circuit 2, to the true input terminal TI and the complementary input terminal TII of the sense amplifier, an explanation is made for the case where the selection of the row line is changed from the row line W0 to W1.

First, in the case where the row line W0 is selected whereas the W1 is not selected, the true memory cell M00 and the complementary memory cell MI00 thus selected turn "ON" and keep "OFF", respectively.

The drain current of the PMOS transistor P1 which is an input of the true current mirror circuit 13 in the sense amplifier 1 is a steady-state current which is determined by the parameter of the negative feedback circuit of the true input circuit 11 and also the characteristic or the state of the memory cell M00. Since the potential of the true input signal SI and the column line D0 is as low as about 1 V, the potential V1A at a node T1, i.e., the gate of the NMOS transistor N1, which is an output from the inverter IN1, becomes a relatively or comparatively high value.

On the contrary, since the complementary memory cell MI00 is "OFF", when the potential of the complementary input signal SII increases to the potential where the NMOS transistor N2 in the complementary input circuit 12 turns off, this NMOS transistor N2 is fixed in this state. The potential V2A at a node T2 becomes a value lower than the potential V1A appearing at the node T1. In this state, the NMOS transistor N2 is "OFF" as described above, so that the input PMOS transistor P2 of the complementary current mirror circuit 14 is also "OFF" and hence the output PMOS transistor P4 is "OFF". Thus, the NMOS transistor N4 in the output current mirror circuit 15 is "OFF" and hence the other NMOS transistor N3 therein is also "OFF".

On the other hand, the input PMOS transistor P1 of the true current mirror circuit 13 is "ON"as described previously, and hence the PMOS transistor P3 is also "ON". As a result, the potential VOA of the output signal SO at the output terminal TO becomes an "H" level which is the power supply potential.

Contrary to the above, in the case where the row line W0 is not selected but the row line W1 is selected, the operation of the entire circuit proceeds in the manner entirely reverse to the explanation given above. As a result, the potential VOA of the output signal SO at the output terminal TO becomes an "L" level which is the ground potential.

For comparison to the embodiment of the present invention described later, the waveforms at the respective nodes in the conventional sense amplifier 1 described above are shown by dotted lines in FIG. 3.

The conventional sense amplifier described above has the following defect. In the steady-state, the potential difference between the gates of the NMOS transistors N1, N2 of the true and complementary input circuits 11, 12 is relatively large, so that the transition in the potential inversion at the row line selecting operation takes place at a comparatively later point in time. The transition in the conventional sense amplifier takes place at the timing point Y in FIG. 3. Thus, the sense amplifier operates at a relatively low speed.

SUMMARY OF THE INVENTION

It is, therefore, a primary object of the invention to overcome the above defect in the conventional amplifier and to provide an improved sense amplifier for use in the non-volatile semiconductor storage device, which is operable at a high speed.

In order to attain the above object, in accordance with the present invention, there is provided a sense amplifier for a non-volatile semiconductor storage device having a plurality of memory cells in a memory cell array, the sense amplifier comprises:

a first and a second current mirror circuit which amplify and detect a true and a complementary input signal, respectively;

a true and a complementary input signal stabilizing circuit for suppressing the potential variation in the input signals, disposed before the first and the second current mirror circuit;

a true and a complementary input signal potential holding means connected with the input sides of the true and the complementary input signal stabilizing circuit for holding the potentials of the input signals and having the current driving capability lower than that of the memory cell in the memory cell array; and a true and complementary sense signal producing circuit for producing a true and a complementary sense signal which determine the operation or non-operation of the true and the complementary input signal potential holding means based on the output logical value of the sense amplifier.

BRIEF DESCRIPTION OF THE DRAWINGS

The above and other objects, features and advantages of the present invention will be apparent from the following description of a preferred embodiment of the invention explained with reference to the accompanying drawings, in which:

FIG. 2 is a circuit diagram of an arrangement of an non-volatile semiconductor storage device including the sense amplifier;

DESCRIPTION OF THE PREFERRED EMBODIMENT

Throughout the following explanation, similar reference symbols or numerals refer to the same or similar elements in all the figures of the drawings.

Figure 4:
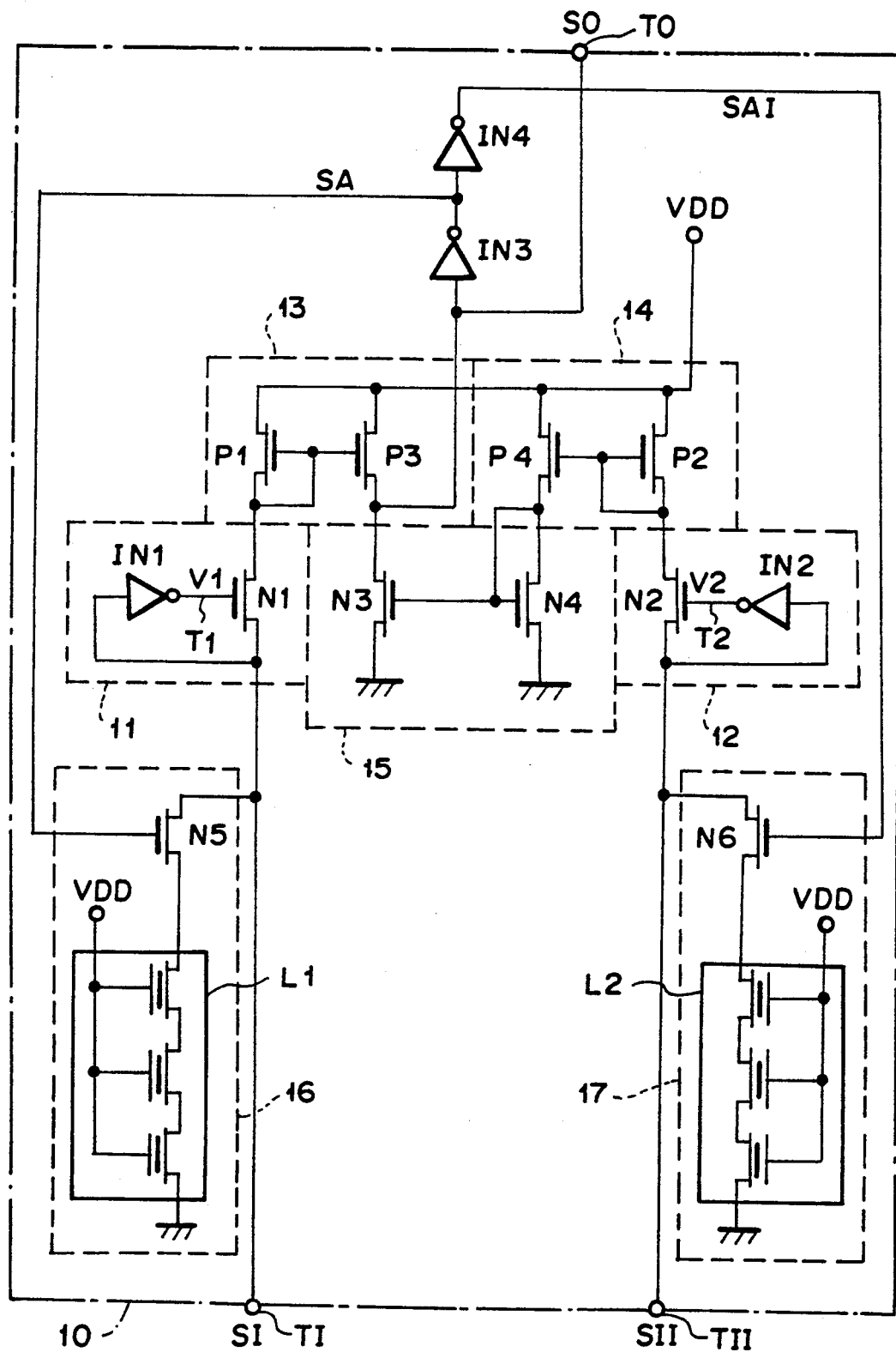
FIG. 4 is a circuit diagram of the embodiment according to the present invention.

FIG. 4 is a circuit diagram showing one embodiment of the present invention.

Figure 1:
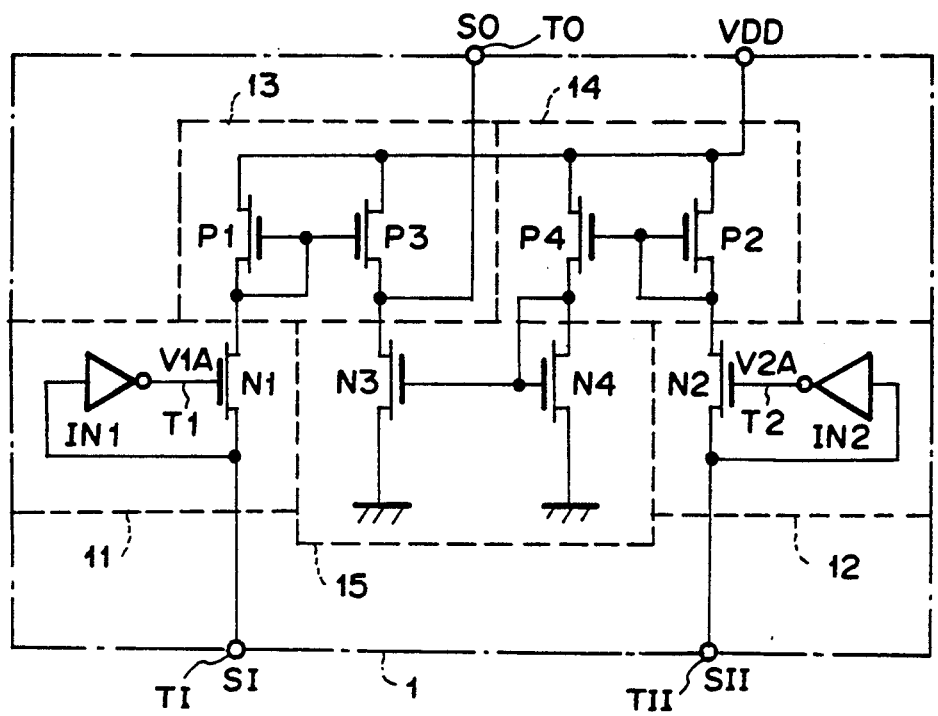
FIG. 1 is a circuit diagram of an example of the conventional sense amplifier.

The arrangement of the sense amplifier 10 shown in FIG. 4 is in part exactly the same as that of the conventional sense amplifier 1 shown in FIG. 1. Differences therefrom reside in the addition of a pair of true and complementary load circuits 16 and 17 connected with the true and the complementary input terminal TI and TII, respectively. In the addition of serially connected inverter circuits IN3 and IN4 that is, a true and complementary sense signal producing circuit, produces true and complementary sense signals Sa and SAI which determine activation or inactivation of these load circuits 16 and 17. Specifically, the sense amplifier 10 according to the present invention is composed of the true input signal stabilizing circuit 11 the load for which is the true current mirror circuit 13; the complementary input signal stabilizing circuit 12 the load for which is the complementary circuit 14; the true and the complementary current mirror circuit 13 and 14; and the output current mirror circuit 15 functioning as an active load for the current mirror circuits 13 and 14. The drain electrode of the NMOS transistor N3 in the output current mirror circuit 15 is connected to the output terminal TO from which the sense amplifier output is forwarded out, and also to an input terminal of the inverter IN3.

The load circuits that is, a true and a complementary input signal potential holding means 16 and 17 holds the potentials of the true and complementary input signals SI and SII, and are composed of the corresponding load elements L1, L2 and the corresponding NMOS transistors N5 and N6 for driving them, respectively. Each of the load elements L1 and L2 is in a three-stage cascade connection of FAMOS memory cells with the gates in all the stages being commonly connected to the power supply voltage VDD. Thus, the current driving capability of each of the load elements L1 and L2 is ⅓ that of a unit memory cell.

The operation of this embodiment will now be explained below. The operation will be explained on the premise that the sense amplifier 10 is one used for a non-volatile semiconductor storage device shown in FIG. 2.

Figure 3:
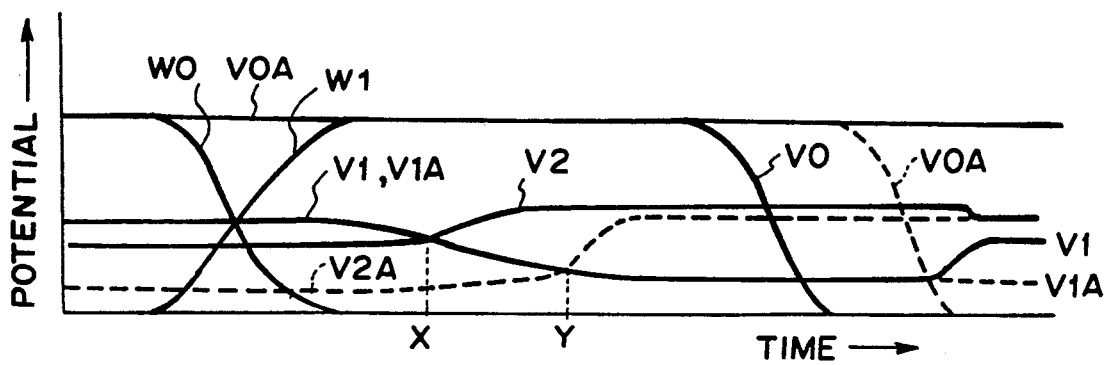
FIG. 3 is a waveform chart explaining the operation of the conventional sense amplifier shown in FIG. 1 by the dotted lines and that of one embodiment according to the invention by the solid lines.

FIG. 3 serves to explain the waveforms of the circuit in this embodiment shown in FIG. 4 in comparison to those of the prior art. In FIG. 3, the solid lines are directed to this embodiment whereas the dotted lines are directed to the prior art.

First, in the case where the row line W0 is selected but the row line W1 is not selected, the output signal SO appearing at the output terminal TO is in the "H" level as already explained in connection with the prior art. Thus, the output signal SA from the inverter IN3 is in the "L" level and the output signal SAI from the inverter IN4 is in the "H" level. Therefore, the NMOS transistor N5 in the true load circuit 16 is "OFF" whereas the NMOS transistor N6 in the complementary load circuit 17 is "ON". As a result, the load circuit 16 is inactivated, so that the load for the true input signal SI seen from the sense amplifier is the same as that of the prior art. Thus, the potential V1 at the node T1 is equal to the potential V1A in the prior art.

On the other hand, the complementary load circuit 17 is activated by the complementary sense signal SAI from the inverter IN4, so that the potential V2 at the node T2 is higher than the potential V2A in the prior art. However, since, as described above, the load element L2 of the load circuit 17 has the current driving capability of about ⅓ that of the essential memory cell M00, the potential V2 at the node T2 does not exceed the potential V1 at the node T1. Accordingly, the output from the sense amplifier 10 has the "H" level which is the same logical value as in the prior art.

Next, an explanation will be given on the operation process wherein the output signal SO from the sense amplifier 10 is inverted to its "L" from its "H" level after the row line selection has been inverted to the row line W1 from the row line W0.

Since the complementary output circuit 16 keeps its inactivated state, the potential V1 at the node T1 proceeds in its transition in the same manner as in the prior art.

On the other hand, since the potential V2 at the node T2 is driven under the current driving capability of the sum of the essential memory cell, e.g., the memory cell MI00 and the load element L2 in the complementary load circuit 17, and also is inherently higher than the potential V2A at the node T2 in the prior art, the inversion of the potential level of the potential V2 at the node T2 with respect to the potential V1 at the node T1 takes place at an earlier time point X as compared with the time point Y in the prior art (see FIG. 3). Consequently, the potential change of the output signal SO, changing from "H" to the ground level "L", also takes place at an earlier time point as shown in FIG. 3.

When the potential VO of the output signal SO is inverted to the "L" level, the output signal SA from the inverter IN3 is inverted to the "H" level, whereas the output signal SAI from the inverter IN4 is inverted to the "L" level. Accordingly, the true load circuit 16 is made activated whereas the complementary load circuit 17 is made inactivated.

As a result, the potentials V1 and V2 at the nodes T1 and T2 proceed to the values reverse to the previous case where the row line W0 is selected but the row line W1 is not selected. Namely, the potentials V1 and V2 proceed to the values of V2 and V1 in the previous case, respectively.

In the embodiment described above, the load elements L1 and L2 in the load circuits 16 and 17 are in the cascade connection of three-stage active elements each being the same FAMOS transistor as the essential memory cell, e.g., M00. However, these load elements may be in the cascade connection of any number of stages since only the required condition is that the current driving capability be lower than that of each of the memory cells in the memory cell array. Further, as long as the above condition is satisfied, the load element of the load circuit is not limited to such active elements as FAMOSs and may well be formed by passive elements such as resistors and capacitors.

As described above, in accordance with the present invention, the true and the complementary input terminal of the prior art sense amplifier are connected with the true and the complementary load circuit which are input signal holding means having a current driving capability lower than that of an essential memory cell. Also, in accordance with the logical value of the sense amplifier output, if it is in the "H" level, the complementary load circuit is activated whereas if it is in the "L" level, the true load circuit is activated. In this way, the operation speed of the sense amplifier at the memory cell selecting operation can be effectively improved.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A sense amplifier for a non-volatile semiconductor storage device having a plurality of memory cells in a memory cell array, said sense amplifier comprising:
   a true and a complementary input terminal (TI, TII) for receiving a true and a complementary input signal (SI, SII) from said memory cells;
   first and second current mirror circuits (13,14) which amplify and detect said true and said complementary input signal from said memory cells, respectively;
   a true and a complementary input signal stabilizing circuit having input nodes connected to said true and complementary input terminals, respectively, and having output nodes connected to input nodes of said first and second current mirror circuits, respectively, for suppressing potential variations in said true and complementary input signals;
   true and complementary input signal potential holding means (16,17) which are connected with said true and said complementary input terminal, respectively, for holding potentials of the true and complementary input signals and having a current driving capability which is lower than the current driving capability of said memory cell in said memory cell array; and
   true and complementary sense signal producing circuit (IN3,IN4) for producing a true and a complementary sense signals which determine an operation or non-operation of said true and said complementary input signal potential holding means based on an output logical value of the sense amplifier.

2. A sense amplifier according to claim 1, wherein each of said true and said complementary signal input potential holding means comprises a plurality of active elements which are connected in a cascade form, and a driving element which drives said plurality of active elements in response to each of said true and complementary sense signals from said true and complementary sense signal producing circuit.

3. A sense amplifier according to claim 2, wherein said active elements are Floating Avalanche MOS transistors (FAMOS transistors).

4. A sense amplifier according to claim 1, wherein each of said true and said complementary signal input potential holding means is composed of passive elements.

5. A sense amplifier according to claim 1, wherein said true and complementary sense signal producing circuit comprises first stage and second stage inverter circuits which are connected in cascade, said first stage inverter circuit having an input node connected to an output node of said sense amplifier and an output node connected to said true input signal potential holding means, and said second stage inverter circuit having an output node connected to said complementary input signal potential holding means.

* * * * *